United States Patent [19]

Kandyba et al.

[11] 4,240,086
[45] Dec. 16, 1980

[54] FILM CRYOTRON

[76] Inventors: Petr E. Kandyba, korpus 438, kv. 11, Moscow, 103498; Dmitry P. Kolesnikov, korpus 301b, kv. 111, Moscow, 103482; Nina I. Komarovskikh, korpus 431, kv. 116, Moscow, 103498; Vadim P. Lavrischev, ploschad Junosti, 4, kv. 22, Moscow; Gennady M. Lapir, korpus 851, kv. 69, Moscow, 103527; Vladimir I. Makhov, korpus 406, kv. 84, Moscow, 103498; Vasily K. Semenov; Anatoly N. Samus, both of korpus 337, kv. 4, Moscow, 103482, all of U.S.S.R.

[21] Appl. No.: 959,246

[22] Filed: Nov. 9, 1978

[30] Foreign Application Priority Data

Nov. 25, 1977 [SU] U.S.S.R. .............................. 2550720
Jun. 26, 1978 [SU] U.S.S.R. .............................. 2630151

[51] Int. Cl.³ .......................................... H01L 27/12
[52] U.S. Cl. ........................................... 357/4; 357/5
[58] Field of Search ........................ 357/5, 4; 307/306

[56] References Cited

U.S. PATENT DOCUMENTS

| | | | |
|---|---|---|---|
| 3,764,863 | 10/1973 | Zappe | 317/234 R |
| 3,803,459 | 4/1974 | Matisoo | 317/234 T |
| 3,868,515 | 2/1975 | Landman | 307/212 |
| 3,913,027 | 10/1975 | Zappe | 330/61A |
| 3,999,204 | 12/1976 | Fulton | 357/5 |
| 4,178,602 | 12/1979 | Kandyba | 357/4 |

OTHER PUBLICATIONS

Landman et al., *I.B.M. Technical Disclosure Bulletin*, vol. 17, No. 11, Apr. 1975, pp. 3483-3484.

*Primary Examiner*—Martin H. Edlow

[57] ABSTRACT

The film cryotron according to the invention comprises a superconducting ground plane with two superconducting electrodes arranged on said ground plane interconnected by an elongated distributed Josephson junction and provided with supply lines. The ground plane and electrodes are all insulated from one another. There are two holes in the ground plane opposite one of the electrodes, arranged so as to form a first screen at a portion in this electrode, shaped as a strip extending along the junction and adjacent thereto, as well as a second screened portion interposed between the holes and connecting the supply line to the middle of the first screened portion, and a third screened portion consisting of two halves which connect the ends of the first screened portion to the points of intersection of the electrode and a control line. At the points of connection to the first portion, the second and third portions have a width which is not in excess of that of the first portion. The cryotron includes at least one control line extending above the electrode opposite which the two holes are provided in the ground plane.

4 Claims, 9 Drawing Figures

FILM CRYOTRON

FIELD OF THE INVENTION

The present invention relates to superconducting microelectronic devices incorporated in digital computer equipment, and, more particularly, to film cryotrons based on the Josephson effect and serving as logic switching elements.

BACKGROUND OF THE INVENTION

There are known film cryotrons of the type that comprises a Josephson junction. These are superocnducting switching devices wherein the critical current of the distributed Josephson junction is controlled by a magnetic field acting upon said junction. A cryotron of this type comprises a superconducting ground plane and two superconducting film electrodes with supply lines. The ground plane and electrodes are arranged one above another and insulated from one another. The electrodes are interconnected by a elongated distributed Josephson junction, for example, a tunnel junction. The cryotron also includes at least one superconducting control line arranged above one of the electrodes and extending along the Josephson junction. The elongated distributed Josephson junction is a junction of which one of the linear dimensions is much greater than the depth of penetration of a magnetic field into the junction, whereas its other linear dimensions are either less than that depth or commensurable therewith. The current gain factor of such cryotrons is not more than two; the curve of their control characteristic, i.e., the curve representing the critical current of the fate versus the control current, is of a shape that differs considerably from the most desired rectangular shape.

The above disadvantages are eliminated in a cryotron of which one of the electrodes and its supply lines are of specially selected shapes. This electrode is a screened strip extending along and adjacent to the Josephson junction. A screened supply line comprising one or more parallel branches is connected to the middle of this strip. At least one control line is arranged above the strip and extends along the Josephson junction. At the points of connection of said supply line to the electrode strip, the width of the branches of the supply line is not in excess of that of the strip; these points of connection are spaced from the points of intersection of the strip boundaries and the control line at a distance which is greater than both the strip width and the depth of penetration of a magnetic field into the Josephson junction. This type of cryotron compares favorably with other known types based on the Josephson junction in that it has a higher current gain and in that its control characteristic curve is of a shape that is more convex and closer to the rectangular shape.

However, an improvement in the control characteristic is due to an increase in the geometrical dimensions of the cryotron which, in turn, is accounted for by two factors. First, the cryotron's area is increased by the area occupied by the branches of the supply line. Second, the control line is arranged above the electrode strip and extends alongside the electrode. This means that the width of the electrode strip cannot be less than the width of the control line plus the allowance for matching of the control line with the strip boundaries. As a result, the width of the electrode strip is 2 to 4 times greater than the minimum possible width. There is another important consideration that must be borne in mind. In order to have a control characteristic curve of a convex shape, it is necessary that the strip length be 5 to 8 times greater than the width of the strip, so that the actual minimum length of the strip is 10 to 30 times greater than the minimum possible length. The dimensions are increased to a still greater extent in the case of the multi-input cryotron which employs two or more control lines arranged side by side in one layer.

There is further known a film cryotron based upon the Josephson effect and having relatively small dimensions, despite the fact that it features a plurality of control lines (cf. IBM Technical Disclosure Bulletin, vol. 17, No. 11, April 1975, p. 3483, the article by B. S. Landman and H. H. Zappe).

In this type of cryotron, a hole is made in the ground plane opposite one of the electrodes which itself is provided with a hole partially overlapping the hole in the ground plane so that the electrode is shaped as a closed loop. One side of the loop is in contact with a distributed Josephson junction, whereas its opposite side is above said hole in the screen. A plurality of control lines are interposed between the screen and electrode, above the hole in the ground plane. Due to the hole in the ground plane, the inductive coupling between the control lines and the electrode loop is sufficiently strong and roughly equal for all the buses.

As a result, the current that flows through the control lines induces a current in the electrode loop and, consequently, in the Josephson junction, which brings the latter to a resistive state. The current gain of the cryotron under review is not more than two, and the shape of the control characteristic curve of this cryotron is far from rectangular. This is due to the fact that the shape of the electrodes does not provide for spatial separation of the transport current flowing through the Josephson junction and the current induced in that junction by the magnetic field produced by the current of the control lines.

It is known that the current gain of a cryotron with a plurality of control lines can be raised by connecting two or more control lines in series by means of superconducting strips. In this case the current through the control lines must flow in the same direction, and the current flowing through said strips must produce no parasitic magnetic field in the region of the Josephson junction. The above requirements account for the fact that the control lines and connecting strips intersect with each other, and this in turn, accounts for a more complicated design of the cryotron.

SUMMARY OF THE INVENTION

It is the principal object of the present invention to provide a film cryotron based on a distributed Josephson junction, which, although it has a plurality of control buses, features small dimensions and a shape of the control characteristic curve close to rectangular.

It is another object of the invention to provide a film cryotron, which, although it has a plurality of control buses, features a high current gain.

It is still another object of the invention to provide a film cryotron featuring a high current gain and capable of operating at a low control current, without complicating the design of the cryotron.

The invention essentially consists in providing a film cryotron comprising a superconducting ground plane with two superconducting electrodes arranged thereon, interconnected by a elongated distributed Josephson junction and provided with supply lines, the ground plane and superconducting electrodes being insulated from one another, the cryotron further including a hole provided in the ground plane opposite one of the electrodes, and at least one control line arranged above the electrode, opposite to which the hole is made in the ground plane, and being characterized in that another hole is provided in the ground plane opposite the same electrode, the two holes being arranged so that they form a first screened portion in that electrode, shaped as a strip extending along the junction and adjacent thereto, as well as a second screened portion interposed betwwen the holes and connecting the supply line to the middle of the first screened portion, and a third screened portion composed of two halves which connect the ends of the first screened portion to the points of intersection of the control line and the electrode, the width of the second and third portions at the points of their connection to the first portion being not greater than the width of the first portion.

In order to increase the current gain of a cryotron having a plurality of inputs by increasing the critical current of the Josephson junction, but without altering the control current, it is expedient that the ground plane be provided with at least one more hole dividing the second screened portion into at least two parallel branches.

In order to increase the current gain by reducing the control current, but without altering the critical current and resistance of the Josephson junction and without complicating the design of the cryotron, it is expedient that the cryotron have at least two control lines extending above that electrode opposite to which the holes are provided in the ground plane, at least one of these lines extending above the zone of that electrode opposite the holes, and that the ends of the control lines, found on the opposite sides of the electrode, be interconnected by a superconducting strip extending between the buses, the holes being provided with superconducting jumpers arranged under the strip, whereas the electrode is provided with holes in a number corresponding to that of the jumpers, each arranged opposite a respective jumper and having a size sufficient to overlap that jumper.

The basic advantage of the film cryotron according to the invention resides in the fact that the shape of its control characteristic curve is close to the rectangular, and in that, although it has a plurality of control lines, it is of a compact size, which accounts for broader functional potentialities of this cryotron as compared to conventional devices used for similar purposes. Another advantage of the cryotron according to the invention is a high current gain, which is realized despite the fact that the cryotron has a plurality of inputs. Finally, the cryotron according to the invention is advantageous in that it provides for a high current gain without increasing the critical current of the Josephson junction and without any substantial complications of the design.

BRIEF DESCRIPTION OF THE DRAWINGS

Other objects and advantages of the present invention will become more apparent from the following detailed description of preferred embodiments thereof to be read in conjunction with the accompanying drawings, wherein.

DETAILED DESCRIPTION OF THE INVENTION

Figure 1:
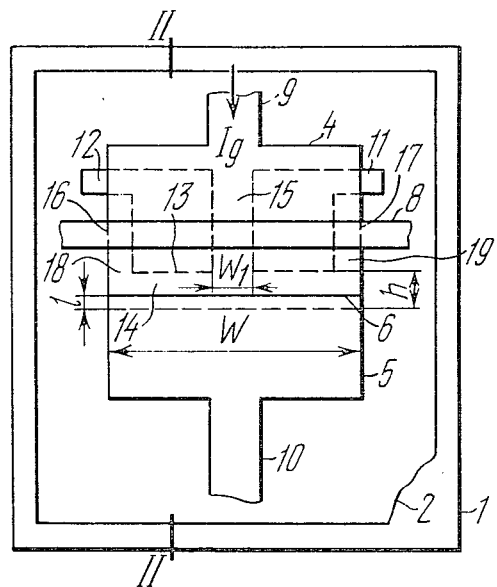
FIG. 1 is a schematic plan view of a cryotron in accordance with the invention, wherein the superconducting electrodes are interposed between the ground plane and the control line.
Figure 2:
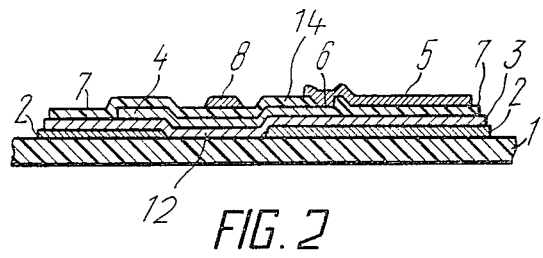
FIG. 2 is a section taken on line II—II of FIG. 1.

The simplest embodiment of the film cryotron in accordance with the invention is presented in FIGS. 1 and 2. The cryotron comprises a substrate 1 and a superconducting ground plane or screen 2 arranged thereon. Insulated by a first dielectric layer 3 from the screen 2 are superconducting film electrodes 4 and 5 interconnected by univariately distributed Josephson junction 6 of a length "w" and width "l". Arranged above the electrode 4 and insulated therefrom by a second dielectric layer 7 is a control line 8. The dielectric layers 3 and 7 are not shown in FIG. 1. For connection to an external circuit, the electrodes 4 and 5 are provided with supply lines 9 and 10, respectively. Holes 11 and 12 are provided in the ground plane 2. Sides 13 of the holes 11 and 12, facing the Josephson junction 6, are the boundary of a first screened portion 14 of electrode 4. The portion 14 is shaped as a strip extending along and adjacent to the junction 6. Connected to the middle of the portion 14 (further referred to as the strip 14) through a second screened portion 15 of the electrode 4, interposed between the holes 11 and 12, is the supply line 9. The connection is such that the continuous screened path for transport of current $I_g$ from the supply line 9 to the junction 6 along the electrode 4 is only through the portion 15. In order to dispense with additional screened paths from the supply line 9 to the ends of the strip 14, the holes 11 and 12 partially extend beyond the boundaries of the electrode 4. Points 16 and 17 of intersection of the control line 8 and the boundaries of the electrode 4 are connected by a third screened portion, consisting of halves 18 and 19, to the ends of the portion 14. In order to ensure the most desired shape of the control characteristic curve, i.e., a shape close to rectangular, the point of connection of the screened portion 15 to the strip 14 must be spaced from the ends of the strip 14 at a distance greater than $\lambda_j$ and h, where $\lambda_j$ is the depth of penetration of the magnetic field into the Josephson junction 6, and h is the width of the strip 14. In order to ensure a maximum current gain with fixed values of w and h, the width $w_1$ of the screened portion 15, i.e., the distance between the holes 11 and 12 at the place of connection to the strip 14, must not be in excess of h.

Figure 3:
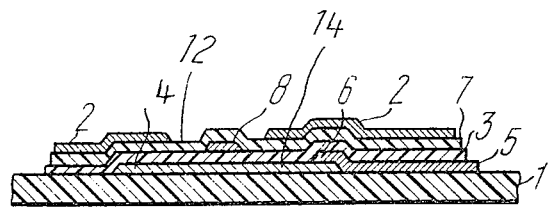
FIG. 3 is a sectional view of a cryotron in accordance with the invention, wherein the control line is interposed between the electrode and the ground plane.

The function of the elongated distributed Josephson junction 6 may be performed by any known type of such junction, for example, a tunnel junction, as shown in FIGS. 2 and 3; it may also be a bridge of variable thickness, in which case the electrodes 4 and 5 do not overlap in the zone of the junction 6, but are interconnected by a jumper of metal or semiconductor material which is thinner than the film of the electrodes. Regardless of the design features, the length w of the junction 6 must be much greater than $\lambda_j$ (for example, $w \approx 10\lambda_j$), whereas the width 1 must be either equal to or less than $\lambda_j$ The control line 8 may be either of the same layer as the electrode 5 (FIG. 2) or of a separate layer (FIG. 3).

FIG. 3 is a sectional view of a cryotron according to the invention, wherein the mutual arrangement of the superconducting layers is different from that of FIG. 2. Viewed from the top, the configuration of the layers of this cryotron is similar to the configuration of FIG. 1. The electrodes 4 and 5, interconnected by the Josephson junction 6, are arranged right on the substrate 1 to be successively followed by the first insulating layer 3, the control line 8, the second insulating layer 7, and the ground plane 2. With such an arrangement of the layers 3 and 7, the control bus 8 is interposed between the electrode 4 and ground plane 2 instead of being above them. This type of cryotron may employ the same types of Josephson junction as mentioned above, but it can also incorporate junctions for which it is either desirable or necessary that the electrodes 4 and 5 should be disposed directly on the substrate 1. For instance, if the substrate 1 is of monocrystalline silicon with a doped surface, the aforementioned arrangement of the layers makes it possible to use the same material for the jumper of the bridge-type Josephson junction. Such an arrangement of the layers provides for maximum heat conduction between the Josephson junction and the monocrystalline substrate, which, in the final analysis, improves the response of the cryotron.

The film cryotron of this invention makes it possible to arrange the three superconducting layers, i.e. the ground plane 2, electrodes 4 and 5, and control line 8, in any order. Apart from the two arrangements described above, a positive effect can be attained by arranging the electrodes 4 and 5 directly on the substrate 1 to be followed by the ground plane 2 and control line 8.

Figure 4:
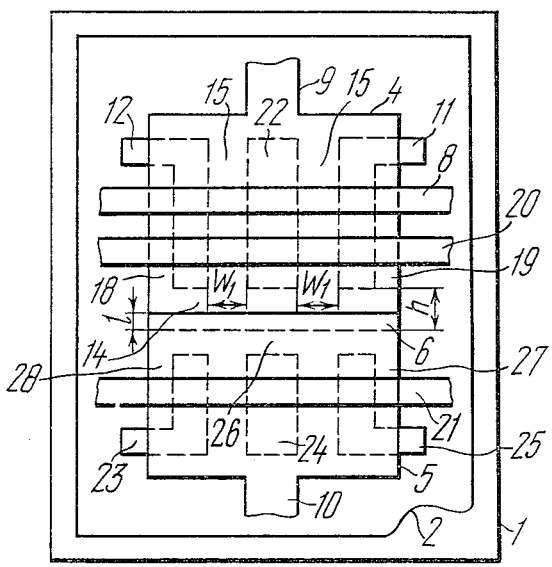
FIG. 4 is a plan view of a cryotron in accordance with the invention, provided with an additional control line and additional holes in the ground plane.

The latter arrangement is compatible with the design of FIG. 3, wherein the two arrangements can be used in a single integrated circuit, which simplifies the layout of the circuit. FIG. 4 is a plan view of a more complicated, multi-input cryotron in accordance with the invention. Unlike the simple design of FIG. 1, the cryotron of FIG. 4 includes additional control buses 20 and 21 and additional holes 22, 23, 24 and 25 in the ground plane 2. The control line 8 and 20 are above, and the control line 21 is under, the electrode 5. The holes 11, 12 and 22 are under the electrode 4 so that the supply line 9 is connected by two continuous screened paths to the middle of the strip 14. Similarly, the holes 23, 24 and 25 are found under the electrode 5. The holes 23, 24 and 25 define the boundary of a screened portion 26 of the electrode 5, which as was the case with the screened portion 14 of the electrode 4, is shaped as a strip extending along the junction 6. Like the third screened portion (the halves 18 and 19) of the electrode 4, screened portions 27 and 28 of the electrode 5 connect the points of intersection of the control line 21 and the boundaries of the electrode 5 to the ends of the strip 26. The cryotron of this type may have more holes in the screen and more control lines above the electrodes. Additional control lines help to expand the logic functions of the cryotron, whereas additional holes under the middle portion of the electrodes, such as the holes 22 and 24 of FIG. 4, account for a higher current gain due to an increase in the critical current of the Josephson junction.

Figure 5:
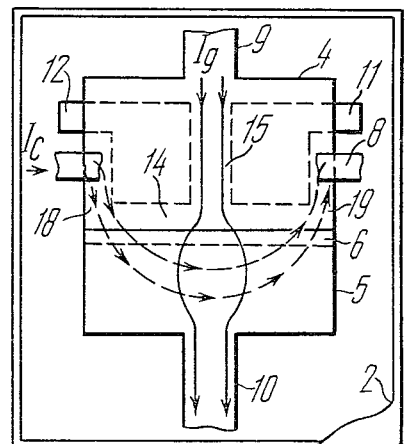
FIG. 5 is a chart of the distribution of currents on the surface of the electrodes facing the ground plane for the arrangement of the layers according to FIG. 2.
Figure 6:
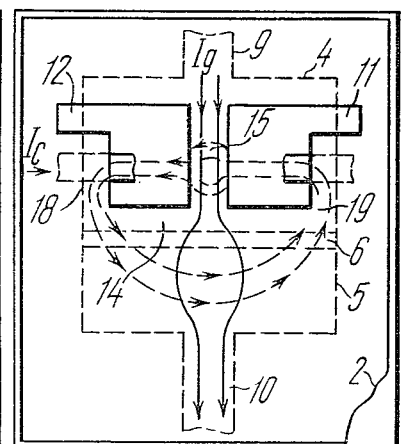
FIG. 6 is a chart of the distribution of currents on the surface of the electrodes facing the ground plane for the arrangement of the layers according to FIG. 3.

With reference to a cryotron having two holes and a single control line, FIGS. 5 and 6 present charts of the distribution of currents flowing on that side of the electrodes which faces the ground plane, and through the Josephson junction. FIG. 5 refers to the arrangement of the layers of FIG. 2, while FIG. 6 refers to that of FIG. 3. The solid lines represent the path of the transport current I form an external circuit (not shown), flowing from the supply line 9 to the supply line 10. The dash lines represent the distribution of currents induced on that side of the electrodes 4 and 5 which faces the ground plane 2 by the current $I_c$ flowing through the control line 8. The distribution of the current $I_c$ over the bus 8 is not indicated.

Figure 7:
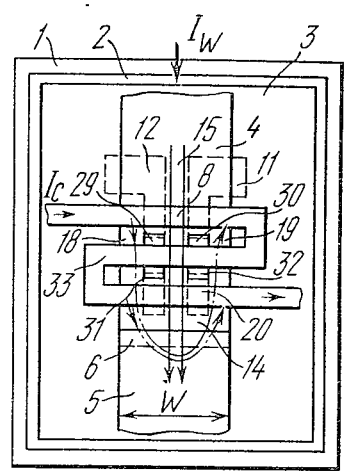
FIG. 7 is a plan view of a film cryotron according to the invention with two serially connected control lines.
Figure 8:
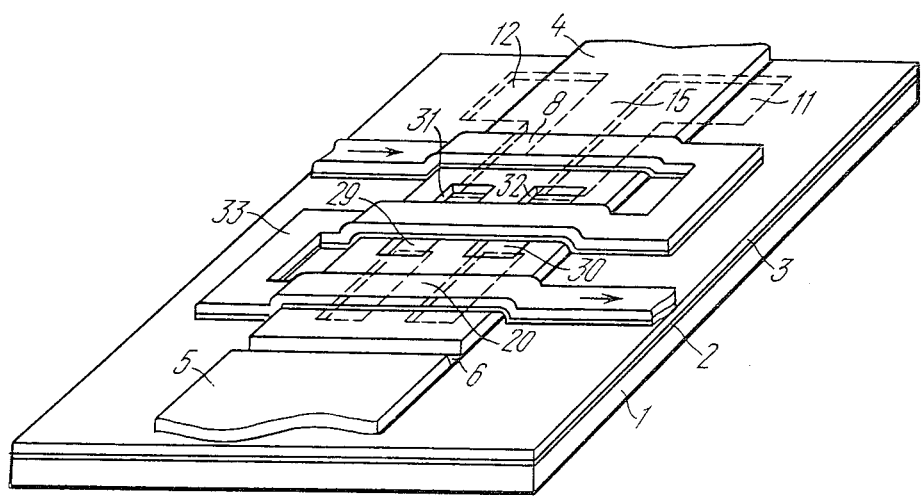
FIG. 8 is a schematic isometrical view of the cryotron of FIG. 7, wherein the Josephson junction is a bridge of a variable thickness.

FIGS. 7 and 8 are each a schematic view of a cryotron according to the invention, having two control lines 8 and 20 connected in series. Like the cryotron of FIG. 1, this cryotron comprises the substrate 1, the ground plane 2 with the holes 11 and 12, and the Josephson junction 6. As in the foregoing cases, the latter may be of a known type; for example, it may be a sandwich-type contact, as shown in FIG. 7, or a bridge of a variable thickness as shown in FIG. 8. In the latter case the superconducting electrodes 4 and 5 are on the same level and interconnected by a thinner metal jumper. Each of the holes 11 and 12 in the screen 2 is divided into two halves by superconducting film jumpers 29 and 30, respectively. Over the jumpers 29 and 30, the electrode 4 has two holes 31 and 32, respectively, which overlap the respective jumpers 29 and 30. Extending above the electrode 4 are the two control lines 8 and 20, interconnected by a superconducting strip 33 interposed between the lines 8 and 20 and arranged above the holes 31 and 32 provided in the electrode 4. As in FIG. 5, the currents in FIG. 7 are indicated by solid and dashed lines. There may be different arrangements of the layers apart from that shown in FIGS. 7 and 8. For example, the order may be as follows: the substrate, the electrodes, the insulating layer, the control lines, and the ground plane. This arrangement does not involve any changes in the configuration of individual elements of the cryotron; viewed from the top, this configuration corresponds to that of FIG. 7. The sizes of the holes 11, 12, 31 and 32, as well as the sizes of the jumpers 29 and 30 and the thickness of the insulating layers are selected so that the inductance of the screened portions 14, 18 and 19 of the electrode 4 is 5 to 10 times less than that of the adjacent unscreened portions.

Figure 9:
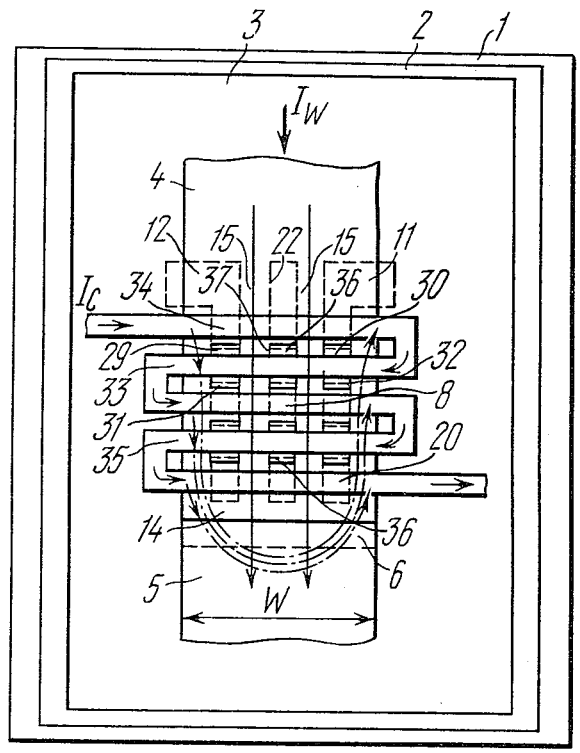
FIG. 9 is a schematic view of a cryotron according to the invention, featuring three serially connected control lines and an increased length of the Josephson junction.

FIG. 9 is a schematic view of a more general embodiment of the invention. Unlike the embodiments of FIGS. 7 and 8, the cryotron of FIG. 8 comprises three control lines 8, 20 and 34 which are connected in series, and two connecting strips 33 and 35 interposed between them. The cryotron of FIG. 8 also features a longer Josephson junction 0; accordingly, the electrode 4 is wider and has two parallel screened portions 15 which connect the supply line to the middle of the screened strip 14 of the electrode 4, extending along the junction 6. The additional hole 22 with two jumpers 36 is provided in the screen 2 between the holes 11 and 12, and holes 37 are provided in the electrode 4 opposite the jumpers 36. The critical gate current of the cryotron of FIG. 9 is about two times as high as that of the cryotron of FIG. 7; the control current of the cryotron of FIG. 7 is 50 percent higher than that of the cryotron of FIG. 9; this means that the current gain of the cryotron of FIG. 9 is about three times as high as that of the cryotron of FIG. 7.

The film cryotron according to the invention operates as follows. With no current $I_c$ in the control line 8 (FIGS. 1, 2 and 5), the superconduction transport current $I_g$ which is not in excess of the critical cyrrent $I_{mo}$, may flow through the junction 6 without producing any voltage. The current $I_g$ flows through the supply line 9, on the surface of the electrode 4 facing the ground plane 2, and through the portion 15 between the holes 11 and 12 to the screened strip 14 to spread about the strip 14 and flow through the Josephson junction 6 over a width which is greater than the width of the portion 15 by about $(2+4)\lambda_m$, where $\lambda_m$ is a characteristic area of the current spread region:

$$\lambda_m = \max(\lambda_j, h).$$

In order to ensure an optimum shape of the control characteristic curve, it is necessary, as in the case of the known cryotron, that the area over which the transport current enters the strip 14 be spaced from the ends of the junction 6 at a distance greater than $\lambda_m$; as a result, the transport current flows over the middle portion of the junction 6 without reaching its ends. When passed through the control line 8, the current $I_c$ induces currents in the electrode 4 arranged above the control bus 8, as well as in the Josephson junction 6 and on that surface of the electrode 5 which faces the ground plane 2. The induced currents are indicated by the dashed lines with arrows in FIG. 5. The distribution of the currents $I_g$ and $I_c$ is always similar regardless of the number of holes and control lines. The only effect that a change in the number of holes and control lines can make is a different share of the current I flowing over one screened portion of the electrode 4 between adjacent holes. The distribution of current in the electrodes close to the Josephson junction 6 is practically independent of the order in which the layers are arranged, as indicated in FIGS. 5 and 6. However, an important difference in the distribution of currents induced in the electrodes is observed under the control line 8. In FIG. 5, the currents close under the control line 8 on the far side of the electrodes 4 and 5 with respect to the ground plane 2. In FIG. 6, the currents also close under the control line 8, but on that side of the electrodes 4 and 5 which faces the ground plane 2. The induced current, about equal to $I_c$, flows from the points of intersection of the control line 8 and the boundaries of the electrode 4 through the screened portions 18, 14 and 19 of the electrode 4, and part of the induced current reaches the electrode 5 through the portions of the Josephson junction 6 which have linear dimensions of about $\lambda_m$ and are close to the ends of the strip 14. The greater the inductance of the strip 14, i.e. the narrower the strip 14, the more current reaches the electrode 5. Before the current induced in the junction 6 reaches a critical value, it is localized at the ends of the junction 6 and has but a small effect upon the critical current $I_m$, because the transport current $I_g$ flows over the middle of the junction 6. As soon as the current close to the ends of the junction 6 reaches a critical value of $2\lambda_m j_c$, where $j_c$ is the linear critical current density of the junction 6, fluxoids start to move from the ends to the middle of the junction 6, which at once reduces the critical current $I_m$. This ensures the desired shape of the control characteristic curve: $I_m = f(I_c)$. The screened portions 18 and 19 close to the ends of the junction 6 serve as an additional potential barrier against the fluxoids, which further helps to improve the shape of the control characteristic curve. In order to mitigate the perturbing effect of the screened portion 15 upon the progress of fluxoids, $w_1$ (FIG. 1) is selected to be less than the width h of the strip. The current gain G of the cryotron according to the invention is roughly equal to the ratio between the length of that portion of the junction 6 through which flows the transport current and the length $(2\lambda_m)$ of that portion at the end of the junction 6 through which flows the induced current before it is equal to the critical current. Thus for a cryotron with two holes (FIG. 1), $G \approx 2$. G can be increased by increasing the length of the middle portion of the junction 6, through which flows the transport current. For this purpose, additional holes are provided in the ground plane 2 as shown in FIG. 4. In this type of cryotron, the transport current coming from the line 9 following different branches, i.e., the screened portions 15 of the electrode 4 between the holes 12, 21 and 11 provided in the ground plane 2, and passes through the junction 6 close to each point of connection of these portions to the strip 14. As in the known types of cryotrons, the current gain of the cryotron according to the invention is proportional to the number of the branches. The presence of a plurality of control lines, such as the lines 8, 20 and 21 shown in FIG. 4, does not affect the distribution of current in the electrodes. The currents induced by the currents flowing through the control lines 8 and 20 are algebraically added together in the junction 6; the current induced by the current flowing through the line 21 is algebraically subtracted from the former currents. Thus, the cryotron of this invention is capable of performing the functions of a multi-input logic element.

A switching logic element of this type can perform different logical functions, depending on the amplitude and polarity of the currents flowing through the control lines 8, 20 and 21. Consider the case wherein all the control currents are of the same polarity and have such an amplitude that the cryotron is brought to a resistive state by passing current through any of the control buses. The inputs above one and the same electrode (for example, the lines 8 and 20 of FIG. 4) perform the OR function, whereas each pair of inputs found above different electrodes (for example, lines 20 and 21 of FIG. 4) performs the modulo two addition function. If the amplitudes of the control currents are reduced so that the cryotron can be brought to a resistive state only by a combination of two currents, the inputs above one and the same electrode can perform the AND functions and majority function, provided there are three such inputs. Two groups of inputs corresponding to control lines above two electrodes can perform more complex threshold functions; for example, the cryotron is switched if the number of unit signals in the first group of inputs minus the number of unit signals in the second group of inputs is greater than a predetermined threshold.

The cryotron of FIGS. 7, 8 and 9 operates as follows. With no current $I_c$ in the control lines 8, 20 and 34, the superconduction transport current $I_w$, which is not greater than the critical current $I_{mo}$, may flow through the junction 6 without producing any voltage. As the current $I_w$ flows through the electrode 4 to the junction 6, it passes on the surface of the electrode 4 facing the ground plane 2 through the screened portion of the electrode 4, i.e., between the holes 11 and 12 according to FIGS. 7 and 8, and between the holes 11, 36 and 12 according to FIG. 9. Near the junction 6 the current $I_w$ is somewhat spread over the screened strip 14 adjoining the junction, and passes through the middle of the junction 6 as in the case of the cryotron of FIG. 1. As in the cryotron of FIG. 1, the region at which the transport current $I_g$ enters the junction 6 must be spaced from the ends of the junction 6 at a distance greater than the depth $\lambda_g$ of penetration of the magnetic field into the junction 6. As the control current $I_c$ is passed through the serially connected lines 20 and 8, it induces currents in the electrode 4 and on that surface of the junction 6 that faces the ground plane 2. The induced currents are indicated by the dashed lines in FIG. 7. Like the cryotron of FIG. 1, the induced currents flow between the points of intersection of the control lines and the opposite boundaries of the electrode 4, through the screened portions 18 and 19 of the electrode 4, and through the end portions of the junction 6. Each of the control lines 8 and 20 produces a current roughly equal to $I_c$; as a result, the total current induced at the ends of the junction 6 is about equal to $nI_c$, where n is the number of the control lines. The jumpers 29 and 30 in the holes 11 and 12 under the connecting strip 33 and intended to ground plane the magnetic field produced by the current flowing through the strip 33 and thus rule out the effects of that field upon the junction 6. The holes 31 and 32 provided in the electrode 4 above the jumpers 29 and 30 separate the screened portion 15 in the middle of the electrode 4, through which flows the transport current, from the screened portions 18 and 19 of the electrode 4, through which flows the current induced by the current $I_c$ of the control lines. Without the holes 31 and 32, the screened portions 18, 19 and 15 would be interconnected at the locations of the jumpers 29 and 30, which would affect the separation of the transport current and the control current in the electrode 4. Thus the holes 31 and 32 in the electrode 4 complement the holes 11 and 12 in the ground plane 2 in that they all help to produce a configuration of the screened portions 14, 15, 18 and 19 of the electrode 4 which is necessary for normal operation of the cryotron.

Operation of the cryotron according to the invention is based on the interrelation between the control current and the critical current of the Josephson junction 6. An increase in the control current leads to an increase in the current it induces at the ends of the junction 6. Before the induced current reaches a critical value, the total critical current of the junction 6 is practically unchanged for the transport current flowing through the middle portion of the junction 6. As soon as the current at the ends of the junction 6 reaches a critical value, fluxoids start to move to the middle of the junction 6 from its ends, whereby the critical current is at once reduced. Thus, with a fixed value of the transport current, the cryotron is switched from a superconducting state to a resistive state, while a desired shape of the control characteristic curve (i.e., a desired relationship between the critical current and the control current) is provided.

The cryotron of the present invention, featuring holes in the ground plane, has two basic advantages over the known cryotron which, like the one of this invention, features a high current gain and a good shape of the control characteristic curve. The first advantage is a reduced size of the cryotron. The second advantage is the possibility of using Josephson junctions arranged right on the substrate. Speaking of the first advantage, today's technology makes it possible to reduce the width h of the strip 14 to 2 to 3 mu because this value is only determined by the accuracy of matching the holes in the ground plane with the junction 6. In the known cryotron, one or more control lines are arranged above this strip, so that the latter cannot be made narrow enough, keeping in mind that, even with a single control line 3 to 4 mu wide, the width of the strip must be 8 to 10 mu. The reduced value of h accounts for a proportional decrease of w; the other linear dimensions of the cryotron are reduced about 2- or 3-fold. This advantageous feature is of special importance for multi-input cryotrons.

Speaking of the second advantage, the holes in the ground plane make it possible to ensure a desired distribution of the current induced in the junction 6 with different arrangements of the ground, for example, when the ground plane is above the Josephson junction—control line structure, to say nothing of the normal arrangement when the ground plane is on the substrate under the junction 6. This advantage makes it possible to expand the nomenclature of junctions used in such cryotrons. For example, it is possible to use the highly effective bridge-type junctions comprising superconductor-semiconductor-superconductor structures with jumpers, the function of which is performed by appropriately doped portions of the semiconductor substrate. The cryotron according to the invention is at its best when it comprises a junction with a high critical current density of more than $10^4$ A/cm$^2$, such as variable-thickness bridges.

The cryotron of FIGS. 7, 8 and 9 makes it possible to add together currents induced in the electrode 4 and junction 6 by individual serially connected control lines, and thus to reduce the control current for switching the cryotron. It is unnecessary that the connecting strips intersect at different levels, so that the whole layout is simple and compact. The area of the cryotron can be reduced 30 to 50 percent, as compared to that of the cryotron with self-intersecting control buses and strips. It is unnecessary that every cryotron have a superconducting junction between the insulated layers. This helps to simplify the design of the cryotrons and to minimize the occurence of rejected devices in the course of cryotron manufacture, keeping in mind that such a junction is a potential cause of failure because of a possible decrease of the critical current.

What is claimed is:

1. A film cryotron comprising:
   a superconducting ground plane;
   a first superconducting electrode arranged on said superconducting ground plane and electrically insulated therefrom;
   a second superconducting electrode arranged on said superconducting ground plane and electrically insulated therefrom;
   an elongated distributed Josephson junction for interconnecting said first superconducting electrode and said second superconducting electrode;
   respective supply lines connected to said first and second superconducting electrodes, respectively;
   a first hole provided in said superconducting ground plane opposite a given one of said first superconducting electrode and said second superconducting electrode;

a second hole provided in said superconducting ground plane opposite said given one of said first superconducting electrode and said second superconducting electrode;

at least one superconducting control line arranged above said given one of said first superconducting electrode and said second superconducting electrode;

said first and second holes being arranged so as to form a first screened portion in said given one of said first superconducting electrode and said second superconducting electrode, said first screened portion being shaped as a strip extending along and adjacent to said Josephson junction and having ends and a middle portion;

said first and second holes being arranged so as to form a second screened portion interposed between said first and second holes and connecting said supply line to the middle portion of said first screened portion;

a control line intersecting said given one of said first superconducting electrode and said second superconducting electrode to form points of intersection therebetween;

said first and second holes being arranged so as to form a third screened portion comprising two halves which connect the ends of said first screened portion to the points of intersection of said control line and said electrode;

said first screened portion being connected to said second screened portion and said third screened portion, respectively, so as to define respective widths of said second screened portion and said third screened portion at said connection with said first screened portion, said first screened portion being of a certain width, the widths of said second and third screened portions at the points of their connection to said first portion being no greater than the certain width of said first screened portion.

2. A film cryotron as claimed in claim 1, wherein at least one more hole is provided in said superconducting ground plane between said first and second holes to divide said second screened portion into at least two parallel branches.

3. A film cryotron as claimed in claim 1, comprising at least two control lines arranged above the given one of said first superconducting electrode and said second superconducting electrode;

at least one of said at least two control lines extending above the zone of said given one of said first superconducting electrode and said second superconducting electrode;

the ends of said at least two control lines being on the opposite sides of said given one of said first superconducting electrode and said second superconducting electrode;

a superconducting strip interposed between and interconnecting said at least two control lines;

said first and second holes being provided with superconducting jumpers of given number arranged under said superconducting strip;

said given one of said first superconducting electrode and said second superconducting electrode being provided with further holes in a number corresponding to said given number of said superconducting jumpers, each of said further holes being opposite a respective one of said superconducting jumpers and having a size sufficient to overlap said respective one of said superconducting jumpers.

4. A film cryotron as claimed in claim 2, comprising at least two control lines arranged above the given one of said first superconducting electrode and said second superconducting electrode;

at least one of said at least two control lines extending above the zone of said given one of said first superconducting electrode and said second superconducting electrode;

the ends of said at least two control lines being on the opposite sides of said given one of said first superconducting electrode and said second superconducting electrode;

a superconducting strip interposed between and interconnecting said at least two control lines;

said first and second holes in said superconducting plane being provided with superconducting jumpers of a given number arranged under said superconducting strip;

said given one of said first superconducting electrode and said second superconducting electrode being provided with further holes in a number corresponding to said given number of said superconducting jumpers, each of said further holes being opposite a respective one of said superconducting jumpers and having a size sufficient to overlap said respective one of said superconducting jumpers.

* * * * *